United States Patent
Carlson et al.

(10) Patent No.: US 9,572,257 B2
(45) Date of Patent: Feb. 14, 2017

(54) MULTI-LAYERED PRINTED CIRCUIT BOARD HAVING CORE LAYERS INCLUDING INDICIA

(71) Applicant: Keysight Technologies, Inc., Minneapolis, MN (US)

(72) Inventors: Brian Wade Carlson, Spokane, WA (US); William Hollender, Santa Rosa, CA (US); Donald Ingram, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 148 days.

(21) Appl. No.: 14/449,089

(22) Filed: Jul. 31, 2014

(65) Prior Publication Data

US 2016/0037637 A1    Feb. 4, 2016

(51) Int. Cl.
*H05K 1/09*    (2006.01)
*H05K 1/11*    (2006.01)

(52) U.S. Cl.
CPC ......... *H05K 1/115* (2013.01); *H05K 2201/041* (2013.01)

(58) Field of Classification Search
CPC .... H05K 1/115; H05K 2201/041; H05K 1/11; H05K 1/112; H05K 1/116
USPC ................ 174/257, 250, 253, 255, 261, 262
See application file for complete search history.

(56) References Cited

U.S. PATENT DOCUMENTS

| | | |
|---|---|---|
| 5,266,380 A | 11/1993 | Renguso et al. |
| 6,091,026 A * | 7/2000 | Yang .................... H05K 3/4638 174/250 |
| 7,883,985 B2 | 2/2011 | Matsui |
| 2013/0065360 A1 | 3/2013 | Wimplinger |

* cited by examiner

*Primary Examiner* — Tremesha S Willis

(57) ABSTRACT

A printed circuit board (PCB) includes a stack of core layers disposed one over another, and electrically conductive interconnects extending vertically in the stack. Each of the core layers includes a substrate having opposite major surfaces, an electrically conductive active trace extending along at least one of the major surfaces, and an indicium. The stack also has an exposed edge where the indicia of the layers are together revealed. The indicia provide identifying and/or fiducial information about the PCB.

20 Claims, 7 Drawing Sheets

MULTI-LAYERED PRINTED CIRCUIT BOARD HAVING CORE LAYERS INCLUDING INDICIA

BACKGROUND

A conventional printed circuit board (PCB) includes a substrate of insulating material having upper and lower major surfaces, and electrical conductors in the form of conductive traces and/or pads on at least one of the major surfaces of the substrate. The conductive pads provide electrical contacts for electronic components to be mounted to the PCB and the conductive traces lead to and from the conductive pads. The electrical conductors are typically formed by forming a layer of conductive material, most notably copper, over an entire surface of the substrate, forming a mask on the conductive layer and which covers some portions of the conductive layer while exposing others, and etching the conductive layer using the mask to remove the portions of the conductive layer exposed by the mask.

Electronic components that are mounted to PCBs include passive electronic components such as resistors, capacitors, and inductors, as well as active electronic components such as integrated circuits (ICs). The electronic components are mounted to the PCB as supported by the substrate and electrically conductively connected to the conductive pads. The conductive traces leading to and from the pads serve to electrically connect the electronic components to each other and constitute what may be referred to as active traces of the PCB. That is, the active traces and the conductive pads form a circuit or part of a circuit along with various ones of the electrical components.

PCBs may be classified as single layer PCBs or multi-layered PCBs. Single layer PCBs have only one core layer and typically include conductive pads and active traces on only one side of the core layer (i.e., at the top of the PCB), and only conductive pads on the other side of the core layer (i.e., at the bottom of the PCB). Both single layer and multi-layered PCBs may have electrically conductive interconnects which electrically connect the conductive pads at different levels in the PCB. Thus, in the case of the aforementioned typical single layer PCB, the interconnects electrically connect the conductive pads and hence, the active traces, on one side of the PCB to the conductive pads on the other side of the PCB. In this case, the PCB can, in turn, connect the electronic components mounted to the PCB at the top thereof to an external electronic device by means of the conductive pads at the bottom of the PCB.

Multi-layered PCBs have been developed to meet the growing demand for more highly integrated electronic devices and for devices that provide greater numbers of functions. Conventional multi-layered PCBs include a stack of core layers each having a substrate and conductive traces (which may be referred to as "active" traces) and/or pads on each of the major surfaces of the substrate, and interposers disposed between vertically adjacent ones of the core layers. The interposers serve to space the core layers from each other in the stack and thereby separate conductive traces at the bottom of one of the core layers from the conductive traces at the top of an underlying core layer in the stack. To this end, the interposer may be a layer comprising a prepreg.

Multi-layered PCBs thus allow for the conductive traces to be embedded in the stack, i.e., allow for greater numbers of interconnections to be provided than a single layer PCB within a given footprint.

Multi-layered PCBs are generally fabricated by laminating the core layers and interposers together in a stack, and then forming the interconnects by drilling a small hole (via hole) into the stack and then plating the surface that defines the via hole or filling the via hole with conductive material to electrically connect desired ones of the conductors of the core layers to one another. An interconnect that extends through the stack may constitute what is referred to as a through-via. An interconnect that extends through one side of the stack and ends within the stack may constitute what is referred to as a blind via.

One problem that can arise in the fabrication process is that the core layers are stacked in the wrong order. This can be very difficult to troubleshoot, especially using conventional DC testing, if it occurs on a middle one of the core layers whose major surfaces are covered and hence, whose conductors are not visible. In particular, if the core layers are stacked in the wrong order, then the vias will still connect to the correct internal traces, such that DC testing indicates proper connectivity. However, having the core layers out of order can cause dramatic errors related to trace impedances and/or greatly reduce the isolation between traces.

One proposed solution to this problem of detecting improper core layer sequencing, as shown in FIG. 1, is to create a "window" through the PCB from top to bottom in the form of a region clear of all conductors (i.e., the copper traces and pads) and in which "window" each core layer has an exclusive number (1-8 in this example) that identifies it. The number is printed in copper on a surface of the substrate of the core layer by the same process used to form the conductors on the surface. Furthermore, these numbers are offset within the window such that they are viewable from top and bottom. However, as FIG. 1 shows, the numbers become progressively obscured by the material of the various layers in the depth-wise direction of the PCB to the point where it becomes difficult to read the numbers identifying lower ones of the core layers. Also, some PCB material types are completely opaque, rendering the "window" ineffective.

Another common problem that occurs during the fabricating of a multi-layered PCB is a misalignment of the core layers. If the core layers are not aligned properly relative to each other (i.e., are mis-registered), albeit even slightly, then the vias may connect to the wrong trace on one of the substrates. When this occurs at a middle core layer, it can create a fault which is quite difficult to find. In the past, X-rays have been used to find these faults, but as PCBs and their conductors have been scaled down, the attainable resolution of the X-ray process imposes limits on the ability of the process to find the defect.

It is also possible to dissect the PCB to determine how accurately the internal layers are registered, but this is a time-consuming and destructive test.

A solution that overcomes these problems, as disclosed in U.S. Pat. No. 5,266,380, is the use of edge fiducial, reference or alignment marks associated with each of the core layers and which allow a determination to be made as to whether the core layers are registered properly and/or have been stacked in the proper order.

However, such fiducial, reference or alignment marks are still lacking in several respects and have not been used to their fullest potential in addressing some of the needs associated with PCBs and their manufacture.

What is needed, therefore, is a PCB that overcomes at least the shortcomings described above.

SUMMARY

According to one aspect, there is provided a printed circuit board (PCB) which has a stack comprising a plurality of core layers disposed one over another, and electrical interconnects extending vertically in the stack, and in which each of the core layers includes a substrate having opposite major surfaces, an electrically conductive active trace extending along at least one of the major surfaces, and an indicium at the outer periphery of the core layer, the stack has a top, a bottom, and an outer peripheral edge of the stack corresponding to one side of the PCB, the indicia of the layers are together revealed at the outer peripheral edge of the stack, and the indicia together form at least one character along said one side of the PCB.

According to another aspect, there is provided a printed circuit board which has a stack comprising a plurality of core layers disposed one over another, and electrically conductive interconnects extending vertically in the stack, and in which each of the core layers includes a substrate having opposite major surfaces, an electrically conductive active trace extending along at least one of the major surfaces, and a fiducial indicium, the stack has a top, a bottom, and internal edges delimiting at least one opening extending vertically in the stack from the top and from the bottom of the stack, and the fiducial indicia of the layers are together revealed within the at least one opening along the internal edges of the stack. Accordingly, a state of the core layers can be discerned from the fiducial indicia even when the sides of the PCB are covered.

According to still another aspect, there is provided a printed circuit board which has a stack comprising a plurality of core layers disposed one over another, and electrically conductive interconnects extending vertically in the stack, and in which each of the core layers includes a substrate having opposite major surfaces, an electrically conductive active trace extending along at least one of the major surfaces, and a fiducial indicium, the fiducial indicia of the layers are together revealed at the exposed edge of the stack, and the fiducial indicia of the core layers in the stack together have form a Vernier scale by which a degree of lateral mis-alignment of any one of the core layers relative to another of the core layers in the stack can be determined.

BRIEF DESCRIPTION OF THE DRAWINGS

These and other objects, features and advantages in accordance with the present inventive teachings will be better understood from the detailed description of the preferred embodiments thereof that follows with reference to the accompanying drawings, in which.

DETAILED DESCRIPTION

Figure 1:
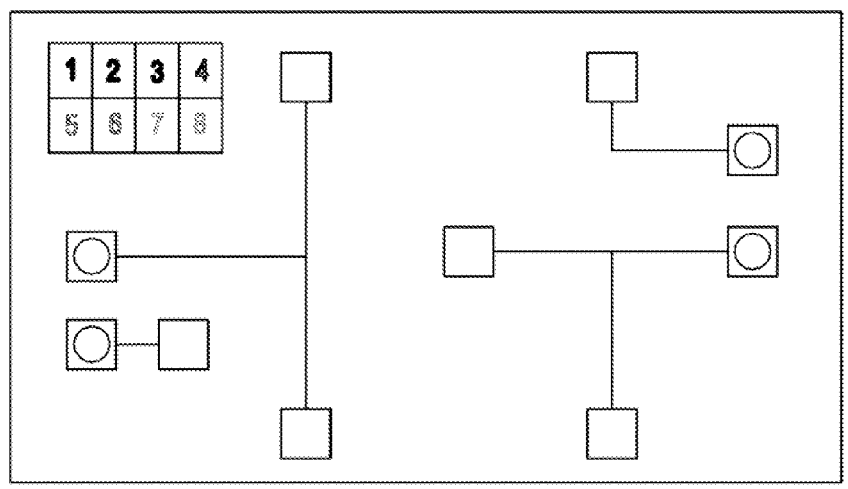
FIG. 1 is a plan view of a conventional multi-layered PCB.

Various embodiments and examples of embodiments will be described more fully hereinafter with reference to the accompanying drawings. In the drawings, the sizes and relative sizes of features, elements and layers may be exaggerated for clarity. Likewise, the shapes of features and elements may be exaggerated and/or simplified for clarity. Also, certain features may be omitted from the drawings for the sake of clarity. That is, the figures of PCBs according to the present teachings are schematic in nature. Also, like numerals and reference characters are used to designate like elements throughout the drawings.

Other terminology used herein for the purpose of describing particular examples or embodiments of the inventive concept is to be taken in context. For example, the terms "comprises" or "comprising" when used in this specification indicates the presence of stated features or processes but does not preclude the presence of additional features or processes. The term "indicium" may be used in the singular or plural sense, e.g., may refer to one or more features which each leave a mark or spot or the like or which define a visible void or voids at the edge of a major surface of a core layer of a PCB according to the present teachings.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other.

As used in the specification and appended claims, the terms 'a', 'an' and 'the' include both singular and plural referents, unless the context clearly dictates otherwise. Thus, for example, 'a device' includes one device and plural devices.

The present teachings generally relate to multi-layered printed circuit boards having interconnects, such as vias.

A first embodiment of a multi-layered PCB 100 will now be described with reference to FIGS. 2A and 2B.

The multi-layered PCB 100 includes a stack 1 of alternatingly disposed core layers 10 and interposers 20 of electrical insulation material, and electrically conductive interconnects 30. Respective ones of the core layers 10 form the top and bottom of the stack 1. Thus, each interposer 20 is interposed between two vertically adjacent ones of the core layers 10. The interposers 20 consist of electrically insulating material and may comprise a pre-preg.

Each of the core layers 10 includes a substrate 10a having opposite major surfaces, electrically conductive active traces 10b extending along at least one of the major surfaces, and an indicium 10c. The electrically conductive interconnects 30 extend vertically in the stack. As best shown in FIG. 2B, the fiducial indicia 10c of the core layers 10 are together revealed at an outer peripheral edge of the stack 1 corresponding to one side of the multi-layer PCB 100. On the other hand, for ease of illustration in FIG. 2B, only some of the active traces 10b are shown in the figures.

The electrically conductive interconnects 30 may constitute vias. In this case, the core layers 10 include conductive pads 31 and each electrically conductive interconnect 30 is electrically connected to at least two of the conductive pads 31 to form a via. FIG. 2B show the case in which the multi-layer PCB 100 has through-vias but the multi-layer PCB 100 may also or alternatively have blind vias. Also, for ease of illustration, conductive pads which form part of the core layers 10 and are located inside the stack 1 are omitted from the figures.

According to a representative embodiment, the indicia 10c together form at least one character along the side of the multi-layer PCB 100 which is optically discernible and provides identifying information about the PCB. In this respect, PCBs are often identified by information provided at the top or bottom of the PCB, such as information written in the (copper) layer that forms conductors at the top of the PCB, information written on the top of the substrate of the top layer by a silkscreen, or information provided by means of a printed label(s) affixed to the PCB. It is often the case, particularly in RF and microwave applications, that PCBs are assembled into modules which cover all but the outer peripheral edges, i.e., the sides, of the PCB. In these cases, the information is unreadable unless the module is disassembled. The multi-layer PCB 100 having indicia 10c in the form of at least one character along a side of the PCB, according to an aspect of the present teachings, opens up a number of possibilities to allow identification of the PCBs within modules.

Not only that but the indicia 10c may be easily produced as that part of the process (described in more detail later on) used to fabricate the conductors of the core layers 10, namely, the active traces 10b or the active traces 10b and the conductive pads 31. In this case, the indicium 10c of each of the core layers 10 may be formed of electrically conductive dummy plating extending along one of the major surfaces of the substrate 10a of the core layer to the outer periphery of the major surface, and which dummy plating is of the same material as the active traces 10b. Dummy plating refers to the fact that plating is electrically isolated from the active traces 10b.

In the illustrated example of this embodiment, the indicia 10c provide alphanumeric identifying information ("Rev 1") about the multi-layer PCB 100. That is, the indicia 10c may form letters, numbers, punctuation marks, etc. In addition, the indicia 10c may spell out text, a word, or an abbreviation. The indicia 10c may also form a code including a code that is machine-readable. Also, it will be readily appreciated that in the case of alphanumeric characters and text, the letters, numbers, etc. appear as dashed but are still readily readable as such.

Another advantage of this embodiment is that as a PCB undergoes revisions, identifying information about each new version of the PCB could easily be provided by adding indicia to that of the previous version, or by significantly forming the same indicia at a different relative location for each revision. This would allow a user to identify the version of the PCB with a simple visual check.

In an extreme case, the indicia 10c could write out a PCB serial number or code, unique to each PCB, along the side of the PCB.

Still another advantage of the first embodiment of the multi-layer PCB 100 according to the present teachings is that the indicia 10c can also provide an indicator of whether the core layers 10 are properly registered, i.e., the indicia 10c may also serve as fiducial indicia. For example, in the case in which the indicium 10c of each core layer 10 is designed to constitute part of a letter or number (such as a sort of a font) extending from the top of the stack 1 to the bottom of the stack 1, if any core layer 10 is mis-registered the letter or number will appear distorted thereby indicating the mis-registration. In the example of FIGS. 2A and 2B, the letter "R" and the number "1" are indicators of whether any of the core layers 10 are mis-registered. Also, it is relatively easy to identify a mis-registration using the letter "R" and the number "1" because these characters have segments that should all be vertically aligned when the core layers 10 are all properly registered.

Furthermore, if it is one or more of the lower core layers that are mis-registered, then the letters "e" and "v" in this example will also be distorted making the mis-registration even clearer. One may readily appreciate how the indicia 10c may be designed to not only provide the identifying information but to ensure that any mis-registration of a core layer 10 can be readily discerned.

It is also contemplated that where space permits dedicated fiducial indicia may be provided in addition to the indicia 10c that provide identifying information about the multi-layer PCB 100, such that the dedicated fiducial indicia ensure that mis-registration of a core layer is detectable through observation.

According to another representative embodiment, the identifying information provided by the indicia 10c of the multi-layer PCB 100 may also be selected, stylized or otherwise configured to provide an optically discernible indicator of whether at least inner ones the core layers 10 are in the correct order in the stack 1.

To this end, the character(s) formed by the indicia include at least one segment extending obliquely relative to the major surfaces of the substrates of the core layers. Again, reference will be made to the example shown in FIGS. 2A and 2B.

In this example, if middle ones of the core layers 10 are stacked in the wrong order during the fabrication process, the indicia 10c that form the number "1" will not indicate the improper ordering of the middle core layers 10 because the segments of the number "1" running through these middle core layers are vertically aligned, i.e., are perpendicular to the major surfaces of the substrates 10a of the core layers 10. On the other hand, the letter "R" can be configured or stylized to include three segments R1, R2, R3 extending continuously from the top of the stack 1 to the bottom of the stack 1 and each of which segments extends substantially obliquely relative to the major surfaces of the substrates 10a of the core layers. Thus, if any of the core layers 10 are stacked in the wrong order during the fabrication process, the indicia 10c that form the letter "R" will indicate the improper ordering of the core layers 10. The same would be true of a character including one line segment extending diagonally from the top of the stack 1 to the bottom of the stack 1, such as if the character were the letter "V" or "M", for example. Note, even though examples have been given in which an indicator of the incorrect ordering of any of the core layers 10 is provided by a single character, more than one character may be needed or used to this end, such as in the case of when the indicia 10c form a word or code including the letters "Y" and "v".

A second embodiment of a multi-layered PCB 200 will now be described with reference to FIGS. 3A, 3B and 3C. This embodiment is useful in applications in which fiducial indicia is not possible or desirable along the side of the PCB including the outer peripheral edges of the substrates of the core layers, due to the need for active conductors at the edges or due to some performance concern.

Like the first embodiment, the multi-layered PCB 200 includes a stack 1 of alternatingly disposed core layers 10 and interposers 20 of electrical insulation material, and electrically conductive interconnects 30. Each of the core layers 10 includes a substrate 10a having opposite major surfaces, an electrically conductive active trace 10b extending along at least one of the major surfaces, and an indicium 10c. The electrically conductive interconnects 30 extend vertically in the stack.

In this embodiment, however, the stack 1 has internal edges delimiting an opening 40 extending through the stack from and between the top and bottom of the stack, and the indicia 10c of the core layers 10 are together revealed within the opening 40 along the internal edges of the stack.

Thus, the indicia 10c are fiducial indicia by which a state of the core layers can be discerned. In the illustrated example, the respective fiducial indicium 10c of each of the core layers 10 is designed to be offset from the fiducial indicium 10c of adjacent core layers 10 in the stack by the same amounts. See FIG. 3 in which the uppermost indicium 10c in the figure represents that of the uppermost core layer in the stack, and the indicia 10c below it in the figure represent the relative locations of the indicia of the core layers in sequence in the downward direction in the stack. Accordingly, the indicia 10c are indicators of whether any of the core layers 10 are mis-registered and of whether any of the core layers 10 have been stacked in the wrong order. That is, as shown in FIG. 3B, in a state in which the core layers 10 are properly registered, the fiducial indicia are aligned in a common plane extending obliquely with respect to the major surfaces of the substrates 10a of the core layers 10.

The opening 40 may be an internal rout or hole (as in the illustrated example) drilled through the stack 1. In the case in which opening 40 is a hole extending through the stack 1, the hole may be a tooling hole used to mount or fix the PCB 200 to a fixture as when an electronic device comprising the PCB is being assembled.

Figure 4A:
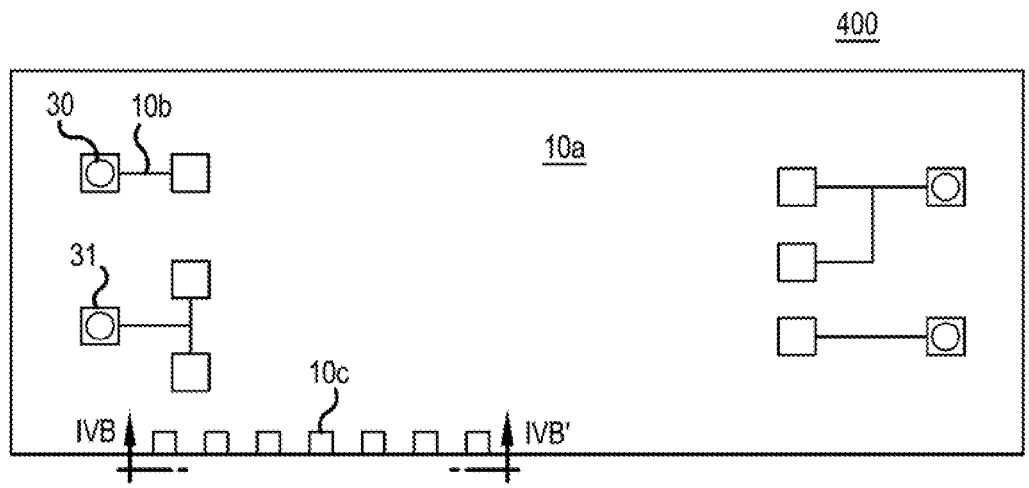
FIG. 4A is a plan view of a third embodiment of a multi-layered PCB in accordance with some present inventive teachings.
Figure 4B:
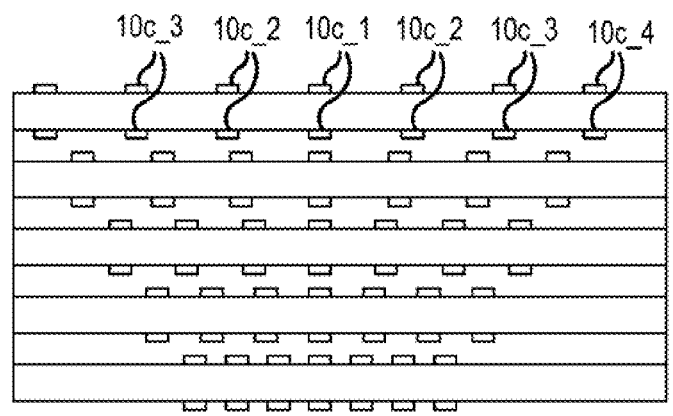
FIG. 4B is a side view of section of the third embodiment of the multi-layered PCB taken along line FIG. IVB-IVB' of FIG. 4A.

A third embodiment of a multi-layered PCB 300 will now be described with reference to FIGS. 4A and 4B. This embodiment provides more complex edge fiducial indicia, namely indicia which includes a built in Vernier capability.

In general, the multi-layer PCB 300 includes a stack 1 of alternatingly disposed core layers 10 and interposers 20 of electrical insulation material, and electrically conductive interconnects 30. Each of the core layers 10 includes a substrate 10a having opposite major surfaces, an electrically conductive active trace 10b extending along at least one of the major surfaces, and indicium 10c. The electrically conductive interconnects 30 extend vertically in the stack.

In this embodiment, the fiducial indicia 10c of the core layers 10 are together revealed at an exposed outer peripheral edge of the stack 1, and together have form a Vernier scale by which a degree of lateral mis-alignment of any one of the core layers 10 relative to another of the core layers 10 in the stack 1 can be determined.

In the illustrated example, the Vernier function is provided by a central column 10c_1 of edge fiducial indicia 10c surrounded by adjacent columns 10c_2, 10c_3, and 10c_4 of edge fiducial indicia for each core layer 10. The fiducial indicia 10c have the same widths as measured in a direction parallel to the edge of the stack 1 along which they are exposed. Also, the columns of edge fiducial indicia 10c_1, 10c_2, 10c_3 and 10c_4 have a regular pitch in or offset the direction of the widths of the indicia in each of the core layers 10, and the pitches or offsets vary among the core layers 10.

In this case, a degree of mis-registration of any core layer 10 can be visually determined and quantified based upon which column of fiducial indicia of a core layer 10 lines up with that of a vertically adjacent core layer 10 in the stack 1. Along the same lines, a similar Vernier scale might be provided by varying the widths of the fiducial indicia across each of the core layers, or a combination of varying the widths and pitch of the fiducial indicia of each core layer.

In addition to providing a Vernier function that allows a mis-registration of a core layer to be identified and quantified, this type of Vernier design also works well as an indicator of the core layers 10 being stacked in the wrong order.

Figure 2A:
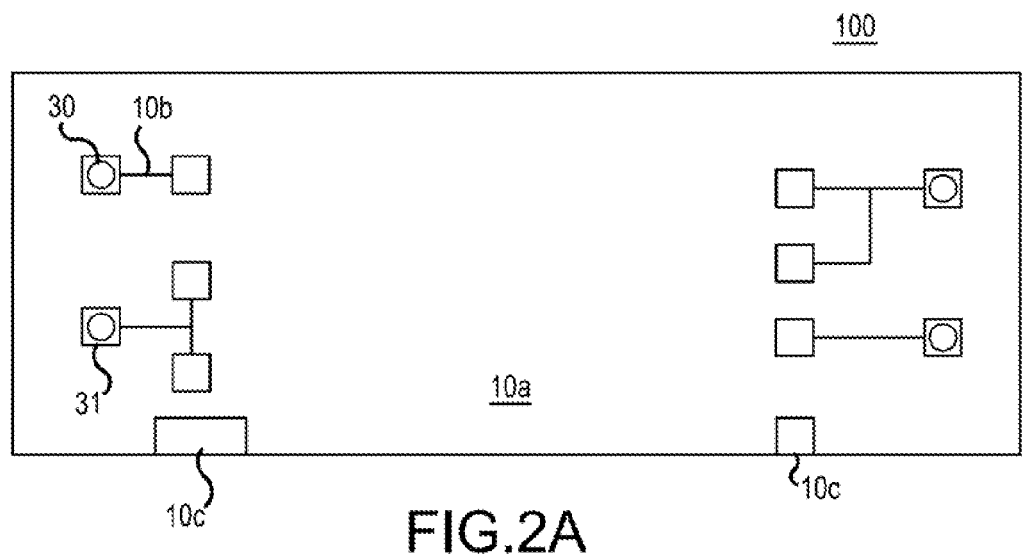
FIG. 2A is a plan view of a first embodiment of a multi-layered PCB in accordance with some present inventive teachings.
Figure 2B:
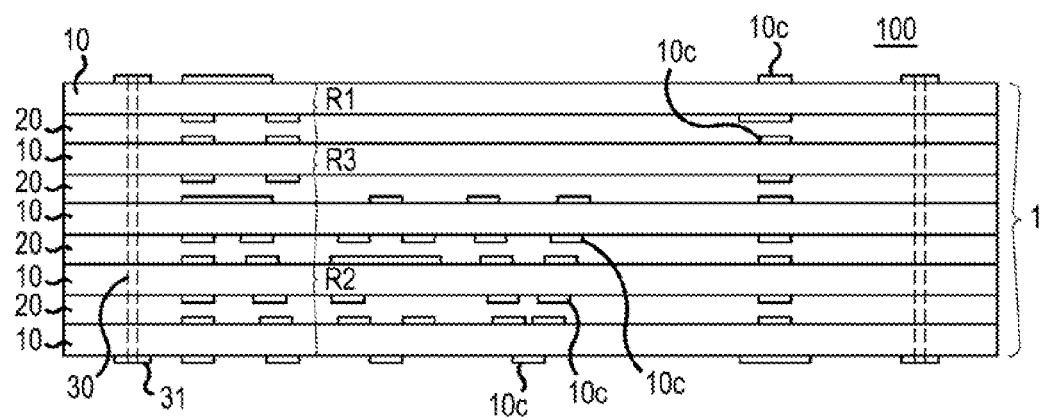
FIG. 2B is a side view of the first embodiment of a multi-layered PCB.
Figure 5:
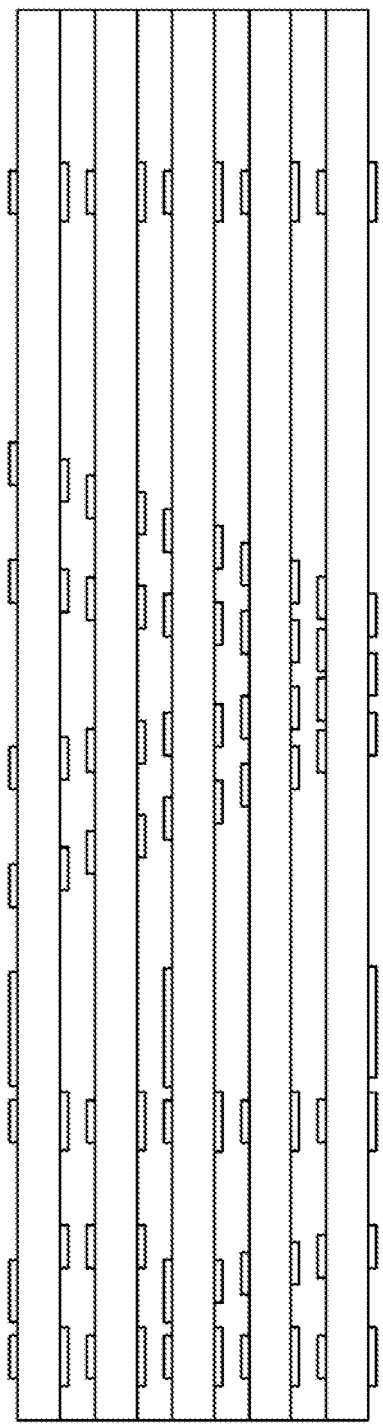
FIG. 5 is conceptual diagram of an example of character of another embodiment of a multi-layered PCB in accordance with some present inventive teachings.

Furthermore, as shown in FIG. 5, a PCB can be provided that combines features of the first embodiment of FIGS. 2A and 2B with the feature of the third embodiment. That is, FIG. 5 shows a character, such as a letter, formed by indicia that also provide a Vernier scale.

A method of fabricating a PCB according to a representative embodiment will now be described with reference to FIG. 6.

First, a plurality of laminae each comprising a substrate having opposite major surfaces, an electrically conductive active trace extending along at least one of the major surfaces, and a fiducial indicium are provided (S100). Then the laminae are stacked and laminated to one another (S200). As a result, the fiducial indicium of at least one of the laminae becomes hidden within the stack. Then, i.e., after the stack has been formed, at least one edge at which a respective portion of the fiducial indicium of each of the laminae are revealed is formed (S300).

This method will now be described in more detail with reference to the fabricating of a multi-layer PCB 100 according to a representative embodiment but which may also be used to fabricate multi-layer PCBs 300 and 400.

Referring to FIGS. 2A, 2B, 6 and 7, a plurality of panels P_1, P_2 . . . P_n are provided (S100). Each panel has opposite major surfaces, a plurality of discrete sets of electrically conductive active traces (10b, 10b . . . ) on each of at least one of the major surfaces and dummy plating Dp. The dummy plating Dp is located in a region between and spaced from the sets of active traces so as to be electrically isolated from the active traces. Advantageously, the dummy plating Dp may be formed at the same time as the active traces 10b on each of the panel and may be take the form of dummy traces.

Next, a stack is formed by disposing the panels P_1, P_2 . . . P_n one over another, and by laminating the panels to one another (S200). In this respect, interposer panels IPP are provided between adjacent ones of the panels in the stack.

Next, the stack is cut (e.g., routed) along at least one line L that passes through the dummy plating Dp of the panels (S300). This simultaneously separates the stack along the line L into a plurality of the multi-layered PCBs 100 and exposes edges of the dummy plating Dp at respective sides of the multi-layer PCBs 100. That is, the dummy plating Dp is divided to form the indicia 10c along a respective side of each resulting multi-layer PCB 100.

Also, the vertical interconnects can then be formed. In examples of this method in which the indicia is fiducial indicia, the interconnects may be formed only when the indicia reveals proper core layer registration and/or ordering. Alternatively, in the case in which the indicia only provides identifying information, the interconnects may be formed before the panels are cut or routed along line L.

Note, using this method in which multiple PCBs are produced from each stack of panels, the dummy plating Dp of the various panels could be readily adapted to form different indicia 10c, e.g., different text or code, for each individual PCB so that each PCB can be correlated with the region of the stack (corresponding regions of the panels) from which it is produced.

The method of FIG. 6 will now be described in more detail with reference to the fabricating of a PCB 200 according to a representative embodiment.

Figure 3A:
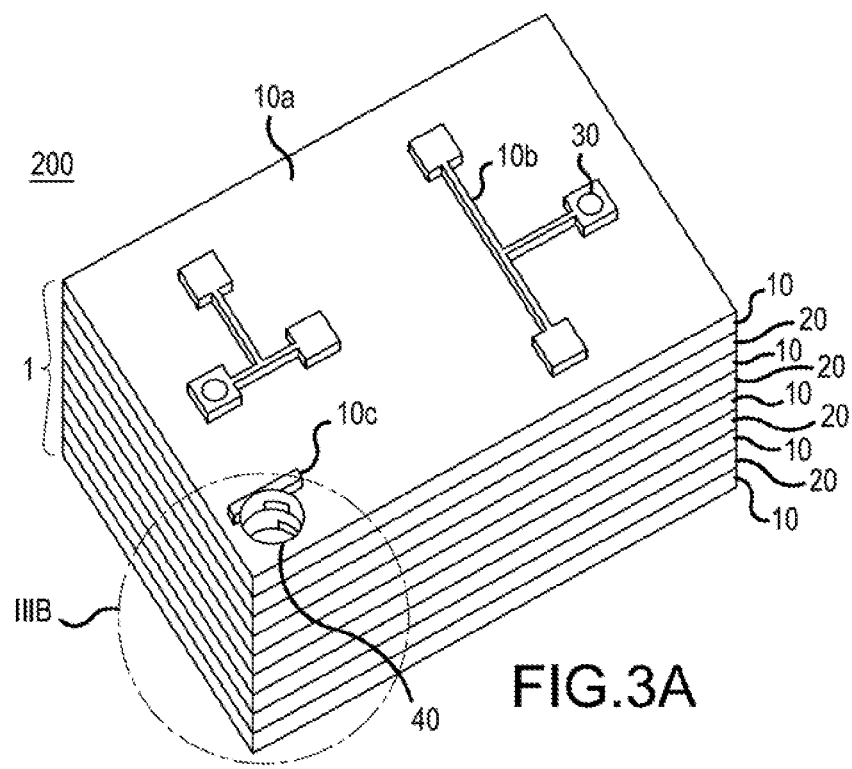
FIG. 3A is a perspective view of another embodiment of a PCB in accordance with some present inventive teachings.
Figure 3B:
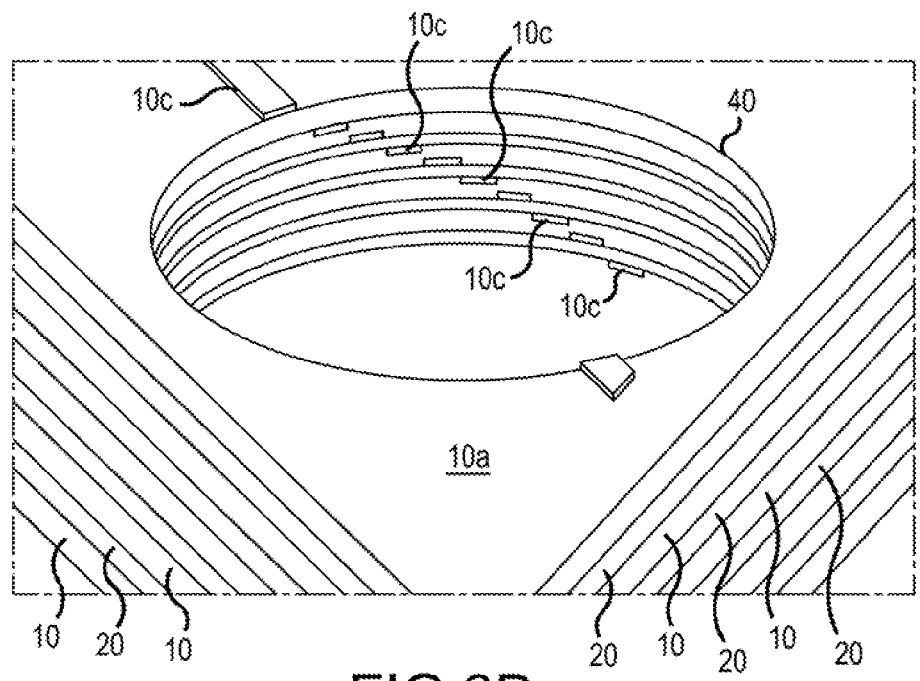
FIG. 3B is an enlarged view of portion IIIB of the PCB shown in FIG. 3A.
Figure 3C:
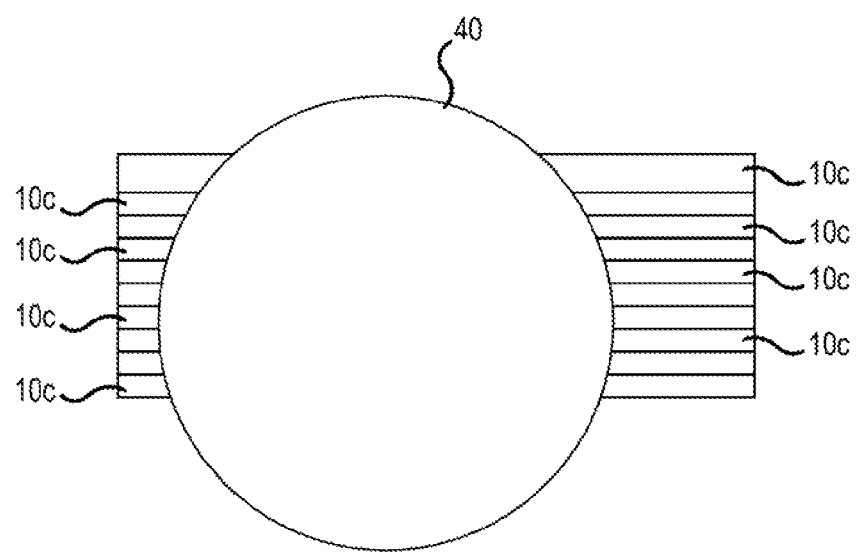
FIG. 3C is a diagram showing an overlay of the fiducial indicia of the core layers and opening through the stack of the PCB shown in FIG. 3A
Figure 6:
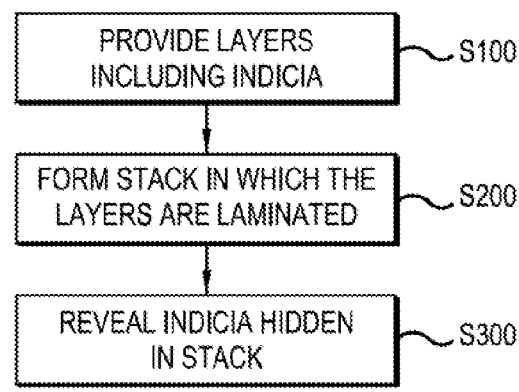
FIG. 6 is a flow chart of a method of fabricating a PCB(s) in accordance with some present inventive teachings.
Figure 7:
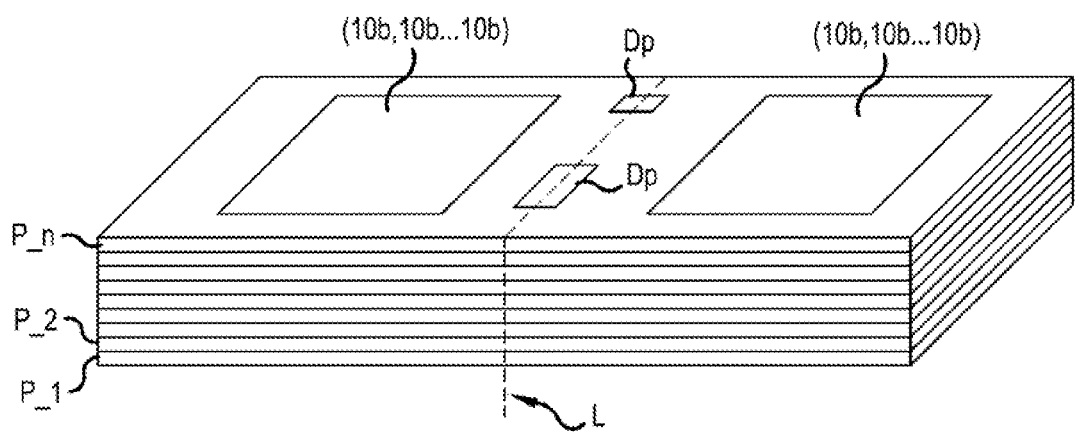
FIG. 7 is a perspective view of a stack of panels from which PCBs are fabricated using the method of FIG. 6, in accordance with some present inventive teachings.

Referring to FIGS. 3A, 3B and 6, first, a plurality of core layers 10 and interposers 20 are provided. Each core layer 10 comprises a substrate 10a having opposite major surfaces, an electrically conductive active trace 10b extending along at least one of the major surfaces, and a fiducial indicium 10c (S100). Then the core layers 10 and interposers 20 are stacked and laminated to one another (S200). As a result, the fiducial indicium of at least one of the core layers 10 becomes hidden within the stack 1. Then, an opening is formed through the stack 1, e.g., an opening 40 is drilled in the stack, at a location that will reveal the fiducial indicia 10c of the core layers 10 within the stack 1 (S300).

Note, the indicia 10c have been shown and described as being constituted by plating at the edges of the substrates, e.g., from the same layer of copper that is etched to form the active traces and conductive pads of the core layers. However, the etching process may be carried out to remove plating at the edges of the substrates and thereby form voids or recesses in the plating which serve as the indicia. That is, although the case has been described in which the indicia has the form of a "positive" image, the indicia can instead have the form of a "negative" image. More specifically, the edge indicia 10c can be laid out manually, using PCB design tools, by running copper traces or plane figures off of the substrate and into the region that is to be cut, routed, drilled, etc. Alternatively, the edge indicia 10c can be created in "negative" by flooding the region with copper planes, and then adding keep-outs to remove the copper where the indicia 10c is desired. In the case of simple forms to be provided by the indicia, such as in the embodiment of FIGS. 3A-3C, either manual process would be both quick and simple to perform. However, in more complex cases such as the case of using the indicia 10c to form text at the side of the PCB, i.e., in the case of the embodiment of FIGS. 2A and 2B, neither method is particularly quick or simple.

This difficulty could be overcome by having the PCB design tool automate the layout of indicia for each of the core layers based on the mere input of basic parameters of a desired fiducial pattern (e.g., Vernier scale), font or word, etc. This could be implemented as a standard feature of the PCB design tool or PCB fabrication (panelization) tool. Alternatively, the PCB design tool could be configured to carry out routines that would automatically populate the design of a PCB with a pad-stack or a set of keep-outs associated with the fiducial patterns, fonts or words based on some design parameter (e.g., a component) associated with the application of the PCB. In this respects, the PCB design tool could be provided with a library in which edge indicia are correlated with the fiducial patterns, fonts or words. The library could take the form of firmware or software, and could be provided in memory of the PCB design tool or in a separate medium such as a disk or memory card. When the component is selected during the design of the PCB, the PCB design tool would automatically lay out the indicia in a manner that would form the desired fiducial pattern, font, word, text, code, etc. at the side of the PCB.

Finally, as is clear from the description above, embodiments of the present teachings and examples thereof have been described above in detail but the present invention may be embodied in many different forms. As yet another example of this, although each indicium 10c has been shown as having a rectangular profile(s) such as that/those of a blaze at the side of a PCB, the indicium 10c may have other forms. For example, the indicium may have the form of dots. Thus, the true spirit and scope of the inventive concept is not limited by the embodiments and examples described above but by the following claims.

What is claimed is:

1. A printed circuit board (PCB) comprising:
   a stack comprising a plurality of core layers disposed one over another, each of the core layers including a substrate having opposite major surfaces, an electrically conductive active trace extending along at least one of the major surfaces, and an indicium at the outer periphery of the core layer; and
   electrically conductive interconnects extending vertically in the stack, and
   wherein the stack has a top, a bottom, and an outer peripheral edge of the stack corresponding to one side of the PCB,
   the indicia of the core layers are together revealed at the outer peripheral edge of the stack, and
   the indicia together form at least one character on the one side of the PCB.

2. The printed circuit board (PCB) of claim 1, wherein the at least one character is alphanumeric.

3. The printed circuit board (PCB) of claim 1, wherein the at least one character comprises a code.

4. The printed circuit board (PCB) of claim 1, wherein the at least one character comprises a letter or a number.

5. The printed circuit board (PCB) of claim 4, wherein the letter or the number extends from the top of the stack to the bottom of the stack.

6. The printed circuit board (PCB) of claim 5, wherein the letter or the number includes at least one segment extending substantially obliquely relative to the major surfaces of the substrates of the core layers.

7. The printed circuit board (PCB) of claim 6, wherein the at least one segment extends from the top of the stack to the bottom of the stack.

8. The printed circuit board (PCB) of claim 4, wherein the letter or the number is stylized to form of a Vernier scale by which a degree of lateral mis-alignment of any one of the core layers relative to another of the core layers in the stack can be determined.

9. The printed circuit board (PCB) of claim 1, wherein the at least one character includes at least one segment extending substantially obliquely relative to the major surfaces of the substrates of the core layers.

10. The printed circuit board (PCB) of claim 8, wherein the at least one segment extends from the top of the stack to the bottom of the stack.

11. The printed circuit board (PCB) of claim 1, wherein the stack further comprises interposers of electrical insulation material each interposed between two respective ones of the core layers, and the interconnects extend through the interposers.

12. The printed circuit board (PCB) of claim 1, wherein the indicium of each of the core layers comprises electrically conductive dummy plating extending along one of the major surfaces of the substrate of the core layer to the outer peripheral edge of the stack, the dummy plating of each of the core layers being of a same material as the active traces of the core layers and electrically isolated from the active traces.

13. A printed circuit board (PCB) comprising:
a stack comprising a plurality of core layers disposed one over another, each of the core layers including a substrate having opposite major surfaces, an electrically conductive active trace extending along at least one of the major surfaces, and a fiducial indicium; and
electrically conductive interconnects extending vertically in the stack, and
wherein the stack has a top, a bottom, and internal edges delimiting at least one opening extending vertically in the stack from the top to the bottom of the stack, the opening comprising an internal hole formed through the stack, and
the fiducial indicia of the layers are together revealed within the at least one opening along the internal edges of the stack, whereby a state of the core layers can be discerned from the fiducial indicia.

14. The printed circuit board (PCB) of claim 13, wherein the stack further comprises interposers of electrical insulation material each interposed between two respective ones of the core layers, and the interconnects extend through the interposers.

15. The printed circuit board (PCB) of claim 13, wherein the substrates of the core layers and/or the interposers are translucent or opaque.

16. The printed circuit board (PCB) of claim 13, wherein the fiducial indicium of each of the core layers comprises electrically conductive dummy plating extending along one of the major surfaces of the substrate of the core layer, the dummy plating of each of the core layers being of a same material as the active traces of the core layers and electrically isolated from the active traces.

17. The printed circuit board (PCB) of claim 13, wherein the fiducial indicia of the core layers lie along a line extending obliquely relative to the major surfaces of the substrates of the core layers.

18. A printed circuit board (PCB) comprising:
a stack comprising a plurality of core layers disposed one over another, each of the core layers including a substrate having opposite major surfaces, an electrically conductive active trace extending along at least one of the major surfaces, and fiducial indicia; and
electrically conductive interconnects extending vertically in the stack, and
wherein the stack has a top, a bottom, and an exposed edge located between the top and bottom of the stack,
the fiducial indicia of each of the core layers are together revealed at the exposed edge of the stack, and
the fiducial indicia of the core layers in the stack together form a Vernier scale, such that the fiducial indicia of each of the core layers is designed to be offset from the fiducial indicia of an adjacent core layer by predetermined amounts, respectively, enabling a degree of lateral misalignment of any one of the core layers relative to another of the core layers in the stack to be determined.

19. The printed circuit board (PCB) of claim 18, wherein the stack further comprises interposers of electrical insulation material each interposed between two respective ones of the core layers, and the interconnects extend through the interposers.

20. The printed circuit board (PCB) of claim 19, wherein the fiducial indicium of each of the core layers comprises electrically conductive dummy plating extending along one of the major surfaces of the substrate of the core layer to the exposed edge of the stack, the dummy plating of each of the core layers being of a same material as the active traces of the core layers and electrically isolated from the active traces.

* * * * *